(12) United States Patent
Barth, Jr. et al.

(10) Patent No.: US 7,791,977 B2
(45) Date of Patent: *Sep. 7, 2010

(54) DESIGN STRUCTURE FOR LOW OVERHEAD SWITCHED HEADER POWER SAVINGS APPARATUS

(75) Inventors: John E. Barth, Jr., Williston, VT (US); Harold Pilo, Underhill, VT (US); Vinod Ramadurai, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 199 days.

This patent is subject to a terminal disclaimer.

(21) Appl. No.: 12/116,322

(22) Filed: May 7, 2008

(65) Prior Publication Data

US 2009/0129192 A1 May 21, 2009

Related U.S. Application Data

(63) Continuation-in-part of application No. 11/940,642, filed on Nov. 15, 2007, now Pat. No. 7,400,546.

(51) Int. Cl.
*G11C 5/14* (2006.01)
(52) U.S. Cl. .................. 365/227; 365/226; 365/230.03; 365/230.06

(58) Field of Classification Search ................. 365/227, 365/230.03, 230.06, 226
See application file for complete search history.

(56) References Cited

U.S. PATENT DOCUMENTS

| | | | |
|---|---|---|---|
| 6,925,022 B2 | 8/2005 | Arimoto et al. | |
| 6,925,025 B2 | 8/2005 | Deng et al. | |
| 7,031,220 B2 | 4/2006 | Watanabe et al. | |
| 7,061,820 B2 | 6/2006 | Deng | |
| 7,139,208 B2 | 11/2006 | Arimoto et al. | |
| 7,307,907 B2 | 12/2007 | Houston | |
| 7,400,546 B1 * | 7/2008 | Barth et al. ................. | 365/227 |

\* cited by examiner

*Primary Examiner*—Huan Hoang
(74) *Attorney, Agent, or Firm*—Cantor Colburn LLP; Michael LeStrange

(57) ABSTRACT

A design structure embodied in a machine readable medium used in a design process includes a tri-state power gating apparatus for reducing leakage current in a memory array. The apparatus includes a first distributed header device coupled to the memory array, the first distributed header device is configured for limiting leakage current through the memory array; and a header driver operatively coupled to the first distributed header device for enabling tri-state operation of the first distributed header device, wherein tri-state operation includes sleep mode, wake mode, and retention mode.

5 Claims, 6 Drawing Sheets

FIG. 3

| Operating Mode | T1 | T2 | T3 | V_VCS |
|---|---|---|---|---|
| Sleep | 0 | 0 | 1 | V_VCS leaks to GND |
| Wake | 1 | 1 | 1 | V_VCS = VCS |
| Retention | 1 | 0 | 0 | V_VCS leaks to VCS-Vtp |

DESIGN STRUCTURE FOR LOW OVERHEAD SWITCHED HEADER POWER SAVINGS APPARATUS

CROSS-REFERENCE TO RELATED APPLICATIONS

This non-provisional U.S. patent application is a continuation in part of pending U.S. patent application Ser. No. 11/940,642, which was filed Nov. 15, 2007, and is assigned to the present assignee.

BACKGROUND OF THE INVENTION

1. Field of the Invention

This invention relates to integrated circuit memory devices, and, more particularly, to a design structure for a low overhead switched header power savings apparatus.

2. Description of Background

Leakage power consumption is an increasing area of concern for high performance memory arrays. Several power savings schemes have been presented in literature to address this issue. For an Application Specific Integrated Circuit (ASIC) chip, one of the paramount design considerations is area. Most power savings schemes known so far typically incur approximately a greater than ten percent (>10%) area penalty to implement the circuits. Furthermore, current schemes only address leakage savings either on the memory cells themselves or on the word line drivers.

SUMMARY OF THE INVENTION

The shortcomings of the prior art are overcome and additional advantages are provided through the provision of a design structure embodied in a machine readable medium used in a design process, the design structure comprising: a multi-mode power gating apparatus for reducing leakage current in a core array, wherein the apparatus comprises: a plurality of distributed header devices correspondingly coupled to a plurality of memory arrays within the core array, each of the plurality of distributed header devices having a plurality of transistor devices in parallel connection with respect to one another, the plurality of transistor devices correspondingly coupled to a plurality of columns within each of the plurality of memory arrays, and each of the plurality of distributed header devices configured for limiting leakage current through each of the plurality of memory arrays; a plurality of header drivers correspondingly coupled to the plurality of distributed header devices, the plurality of header drivers being configured for correspondingly enabling the plurality of distributed header devices to operate in a plurality of operational modes including a sleep mode, a wake mode, and a retention mode, at least one of the plurality of distributed header devices is operating in wake mode while the remaining of the plurality of distributed header devices are operating in sleep mode or retention mode when the core array is accessed; and a plurality of word-line drivers correspondingly coupled to a plurality of word-lines within each of the plurality of memory arrays, the plurality of word-line drivers coupled to each of the plurality of memory arrays is configured for correspondingly accessing one of the plurality of word-lines in each of the plurality of memory arrays, the plurality of word-line drivers coupled to each of the plurality of memory arrays further configured for operating in the plurality of operational modes, the plurality of word-line drivers of one of the plurality of memory arrays is operating in wake mode while the plurality of word-line drivers of each of the remaining plurality of memory arrays are operating in sleep mode or retention mode reducing power leakage in the plurality of word-line drivers, the operation of the plurality of word-line drivers of each of the plurality of memory arrays being controlled by at least one of the plurality distributed header devices.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution for implementing a multi-mode power gating apparatus for reducing leakage current in a core array.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 3 illustrates a table showing the combination of states of a transistor devices in the apparatus in accordance with one exemplary embodiment of the present invention;

Figure 1:
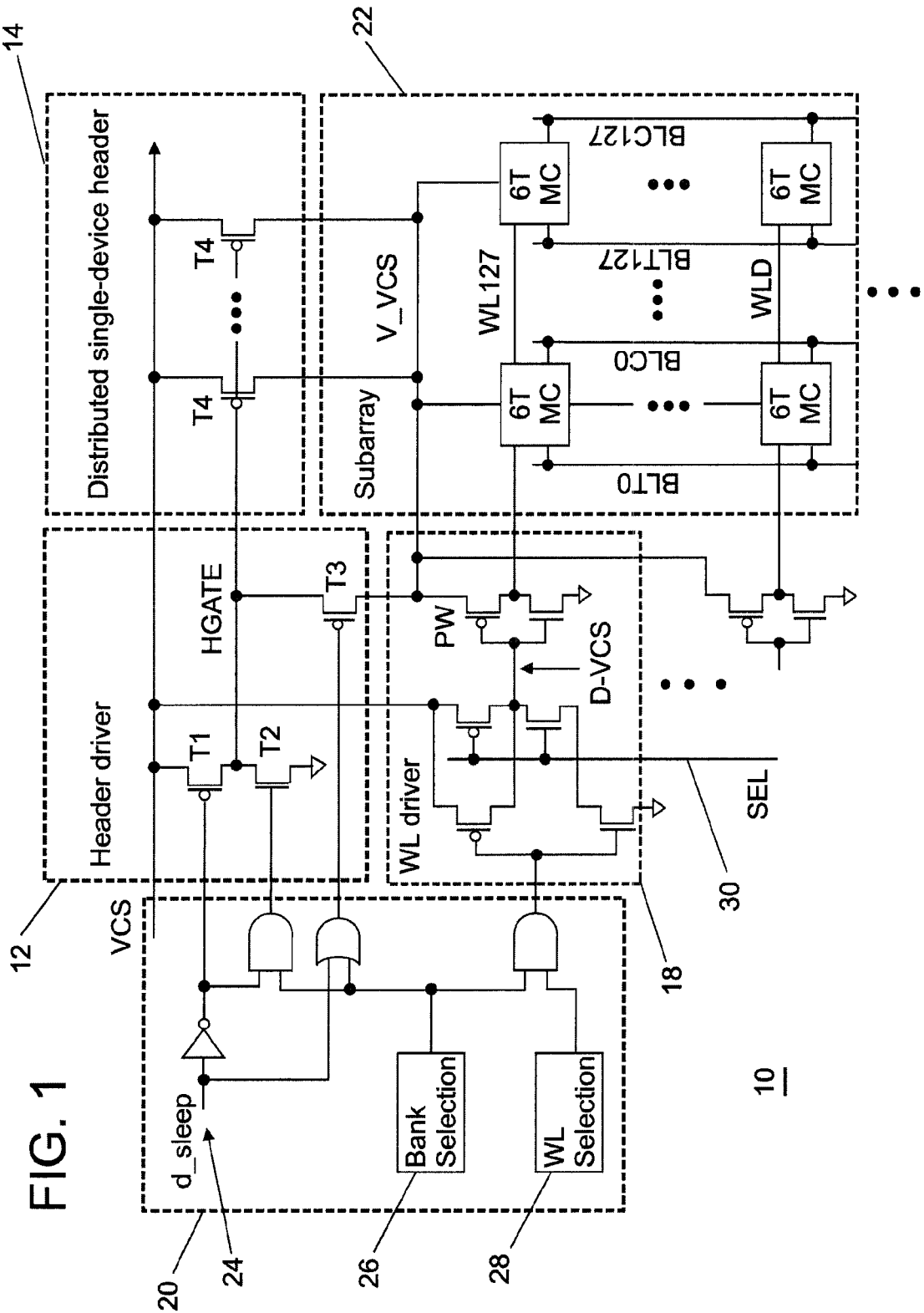
FIG. 1 illustrates a schematic diagram of a multi-mode power gating apparatus in accordance with one exemplary embodiment of the present invention.

The detailed description explains the preferred embodiments of the invention, together with advantages and features, by way of example with reference to the drawings.

DETAILED DESCRIPTION OF THE INVENTION

For the purposes of the present invention the terms bank, memory array, array, and sub-array may be considered as equivalent terms. It should be understood that the structure of Positive Channel Field Effect Transistors (PFETs) and Negative Channel Field Effect Transistors (NFETs) used in exemplary embodiments of the present invention in their simplest form include a gate electrode over a gate dielectric over a channel region in a semiconductor substrate with a source and a drain formed in the substrate on opposite sides of the channel region. It is contemplated that other structurally complex PFETs and NFETs as known in the art may be used in exemplary embodiments of the present invention.

Exemplary embodiments of a power gating apparatus and a method of using the same in accordance with the present invention will now be described with reference to the drawings. The exemplary embodiment of a power gating apparatus described herein is configured to couple a plurality of distributed header devices correspondingly to a plurality of arrays within a core array, where each of the plurality of distributed header devices includes a plurality of transistor devices in parallel connection with respect to one another and the plurality of transistor devices is correspondingly coupled to a plurality of columns within each of the plurality of memory arrays, thus having each of the plurality of distributed header devices limit leakage current through each of the plurality of memory arrays. The exemplary embodiment of a power gating apparatus described herein is further configured to correspondingly couple a plurality of header drivers to a plurality of distributed header devices, where the plurality of header drivers are configured for correspondingly enabling the plurality of distributed header devices to operate in a plurality of operational modes including a sleep mode, a wake mode, and a retention mode where at least one of the plurality of distributed header devices is operating in wake mode while the remaining of the plurality of distributed header devices are operating in sleep mode or retention mode. The exemplary embodiment of a power gating apparatus described herein is configured to provide a plurality of word-line drivers correspondingly coupled to a plurality of word-lines within each of the plurality of memory arrays. In this exemplary embodiment, the plurality of word-line drives coupled to each of the plurality of memory arrays is configured for correspondingly accessing one of the plurality of word-lines in each of the plurality of memory arrays. In this exemplary embodiment, the plurality of word-line drivers coupled to each of the plurality of memory arrays is further configured for operating in a plurality of operational modes, wherein the plurality of word-line drivers of one of the plurality of memory arrays is operating in wake mode while plurality of word-line drivers of each of the remaining plurality of memory arrays are operating in sleep mode or retention mode, thereby reducing power leakage in the plurality of word-line drivers. In this exemplary embodiment, the operation of the plurality of word-line drivers in each of the plurality of memory arrays is controlled by at least one of the plurality of distributed header devices. In one exemplary embodiment, the plurality of distributed header devices includes a plurality of transistors (e.g., PFETs) that selectively couple memory cells within the core array to a primary power rail. The plurality of header drivers controls the operation of the plurality of distributed header devices through a combinational logic network, which will further be described in detail below.

The inventors herein have recognized that having a header driver for each single distributed header device coupled to one of many arrays within a core array, where the header driver for each distributed header device enables three states of operation (sleep mode, wake mode, and retention mode) of each distributed header device, addresses the leakage power issue on high performance memory arrays. This granular scheme saves considerable amount of leakage power, which in accordance with one embodiment is approximately greater than 35%, on the memory cells. This scheme further eliminates leakage power on the word line (WL) drivers, which in accordance with one embodiment is approximately 99% of reduction while incurring a minimal area penalty of approximately less than 1.5%.

Figure 2:
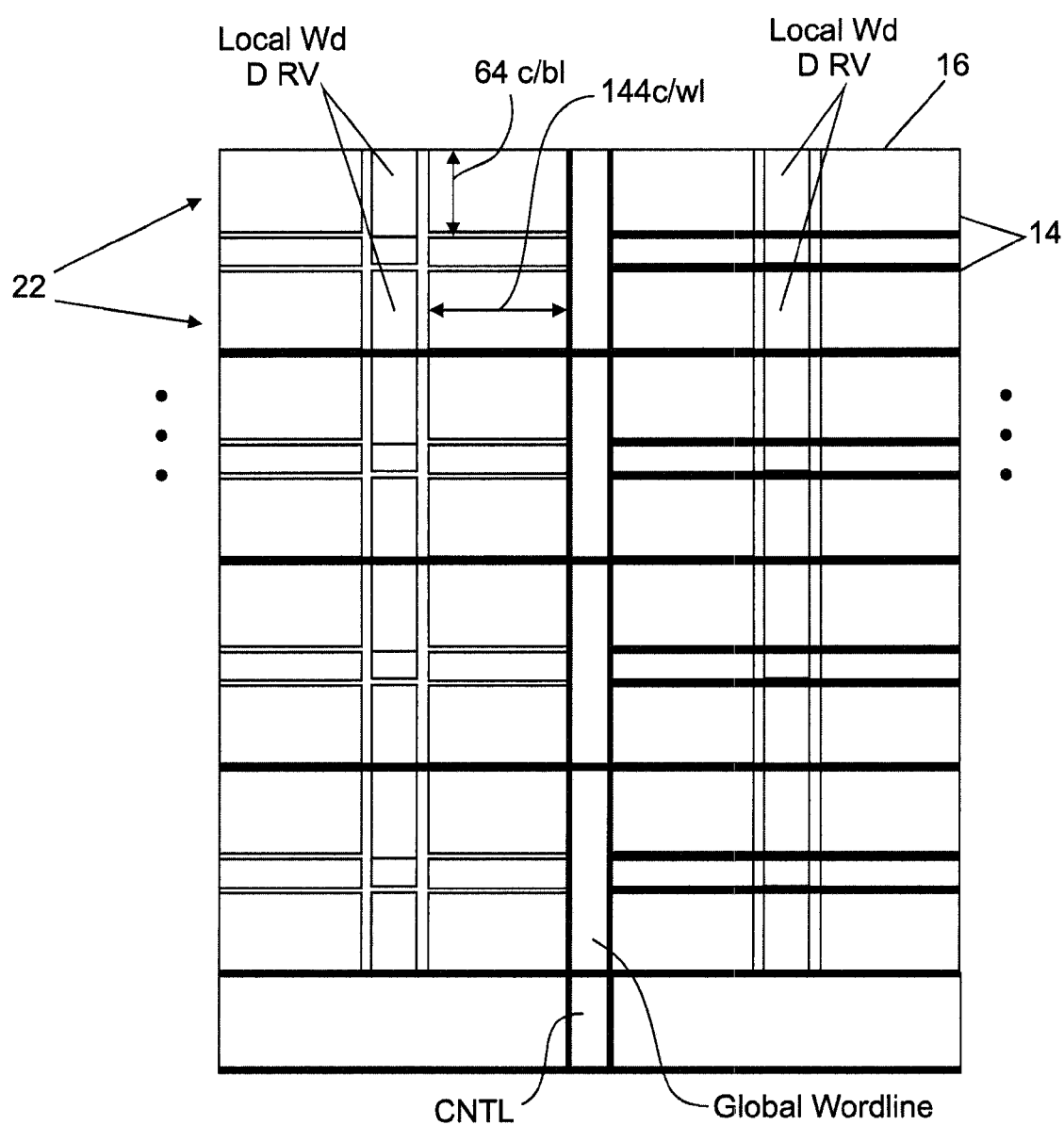
FIG. 2 illustrates a perspective view of a core array in accordance with one exemplary embodiment of the present invention.

Now referring to the drawings, FIG. 1 illustrates a schematic diagram of a multi-mode power gating apparatus 10 for reducing leakage current in memory arrays within a core array according to one embodiment of the present invention. The apparatus includes a header driver 12 and a distributed header device 14 associated with every memory array in a core array 16 (FIG. 2). An exemplary core array 16 having a number of memory arrays each having an associated distributed header device 14 is shown in FIG. 2, which will be described in more detail below. As such, for example, if the apparatus includes a core array with four memory arrays, then the apparatus further includes four header drivers and four distributed header devices that are respectively associated with the four memory arrays. The apparatus further includes a WL driver 18 associated with every word-line in each memory array configured for accessing the memory array. Thus, each word-line in each memory array has an associated WL driver 18. The apparatus further includes a decoder device 20 associated with every memory array in the core array configured for powering on the memory array or placing the memory array in power savings mode. Within the core array, only one memory array is powered on while the remaining memory arrays are placed in power savings mode at any given time when the core array is being accessed in accordance with one exemplary embodiment of the present invention. In doing so, a considerable amount of leakage power on the memory arrays that are placed in power savings mode is reduced, consequently reducing a considerable amount of leakage power within the core array 16.

In accordance with one exemplary embodiment, the core array 16 shown in FIG. 2 includes a number of memory arrays organized in rows and columns and correspondingly multiple word lines and bit lines. For ease of discussion, however, only a single memory array 22 is illustrated in FIG. 1 along with the associated header driver 12 and distributed header device 14. Moreover, for simplistic purposes, only WL driver 18 associated with one of many word-lines in memory array 22 is illustrated in FIG. 1. However, it should be understood that each word-line in memory array 22 has its own WL driver coupled thereto. In other words, each memory array 22 in core array 16 has a number of WL drivers, such as the WL driver 18 illustrated in FIG. 2. For example, if the apparatus includes a core array with 128 word lines, then the apparatus further includes 128 WL drivers. The memory array 22 includes N word-lines (WL) and M bit-lines (BL). For example, the size of memory array 22 is 128 WL×128 BL. Of course, memory array 22 and the other memory arrays within core array 16 may be of any size and should not be limited to the size illustrated. It should be understood that the core array 16 may comprise of a hierarchy of memory arrays having memory cells for storing a bit of information in various configurations. The hierarchy as shown in FIGS. 1-2 is exemplary in nature and should not be limiting. In one non-limiting exemplary embodiment, core array 16 is a Static Random Access Memory (SRAM). Of course, other types of semiconductor memory may be used in other exemplary embodiments of the present invention.

FIG. 2 illustrates a configuration of the core array 16 in accordance with one exemplary embodiment of the present invention. In this configuration, eight memory arrays 22 are disposed within core array 16. Of course, this configuration is exemplary in nature and should not be limiting. However, FIG. 2 illustrates how each distributed header device 14 can be disposed with respect to the associated memory array in core array 16. It should be understood that other configurations are contemplated and should not be limited to the configuration as shown.

The decoder device 20 in FIG. 1 may be any conventional decoder device known in the art having circuitry for providing the header device 12 and the WL driver 18 associated with memory array 22 logical signals (e.g., logical 0) resulting from logical gates (e.g., logical AND gates) of decoder driver 20 for selectively placing memory array 22 in operational mode or power savings mode in accordance with one exemplary embodiment. The logical signals result from a sleep signal 24, a bank selection block 26, a WL selection block 28, or a combination thereof. The sleep signal 24 and the bank output of bank selection block 26 are presented from logical gates of decoder device 20 to header driver 12 and WL driver 18 for selectively placing the memory array 22 in operational mode or power savings mode. The sleep signal 24 is configured to selectively place memory array 22 in power savings mode. The output of bank selection block 26 is configured to selectively access memory array 22 and place memory array 22 in operational mode. The output of WL selection block 28 and the output of bank selection block 26 are presented from logical gates to WL driver 18, which is one of many WL drivers coupled to memory array 22, for selectively accessing the associated word-line within memory array 22. The output of WL selection block 28 is configured to allow access to a particular word line in memory array 22. A select signal is also presented to the WL driver 18 via a communication line 30. The select signal activates during a Read or Write operation and is coupled to each WL driver associated with memory array 22. Both the select signal and the WL selection signal 28 need to be active to activate a word-line in memory array 22. The operational modes will be discussed in greater detail below.

In accordance with one embodiment, the header driver 12 is coupled to the distributed header device 14, which is coupled to memory array 22. The header driver 12 may be coupled to the distributed header device 14 directly or indirectly depending on the application. Similarly, the distributed header device 14 may be coupled to memory array 22 directly or indirectly depending on the application. However, for exemplary purposes and for each instance above, a direct connection is illustrated. Consequently, the header driver 12 is in signal communication with distributed header device 14, which is in signal communication with memory array 22. The header driver 12 includes a plurality of transistor devices T1, T2, T3 configured for enabling the distributed header device 14 to operate in a plurality of operational modes. The plurality of operational modes includes Sleep mode, Wake mode, and Retention mode, which will be described in greater detail below. In one non-limiting exemplary embodiment, transistor device T1 is a PFET, transistor device T2 is an NFET, and transistor device T3 is a PFET. Of course, a combination of PFETs and NFETS may be used to form header driver 12 and should not be limited to the configuration as shown. Furthermore, other structurally complex PFETs and NFETs may be used in other exemplary embodiments of the present invention and should not be limited to the configuration as shown.

In accordance with one exemplary embodiment, the distributed header device 14 includes a plurality of transistor devices T4 correspondingly coupled to columns in memory array 22. In one exemplary embodiment, the plurality of transistor devices T4 are in parallel connection with respect to one another. In one exemplary embodiment, the plurality of transistor device T4 logically and electrically function as the same device. In one non-limiting exemplary embodiment, transistor devices T4 are PFETs. Of course, other structurally complex PFETs may be used in other exemplary embodiments of the present invention and should not be limited to the configuration as shown. Although only two transistor devices T4 are shown in FIG. 1, it should be understood that more or less than two transistor devices T4 could be used depending on the application or the number of columns in memory array 22. The plurality of transistor devices T4 of distributed header is configured for operating in the plurality of operational modes as dictated by header driver 12.

In accordance with one exemplary embodiment, transistor device T1 of header driver 12 is configured to enable or control transistor devices T4 of distributed header device 14 to operate in a Sleep mode or Off mode. In one embodiment, Sleep mode is enabled when a logical 0 from a logical gate of decoder device 20 is presented to transistor device T1, thus turning transistor device T1 "ON". In one embodiment, the logical gate providing a logical 0 to transistor T1 is a logical inverter configured to receive the sleep signal 24. In operation, when transistor device T1 is turned "ON", the respective gates of transistor devices T4 are each placed to a logical 1. Consequently, transistor devices T4 are turned off or operating in Sleep mode. In Sleep mode, transistor devices T4 electrically open or isolate a primary power rail (VCS node) from a secondary or virtual power rail (Virtual_VCS node or V_VCS node). The primary power rail is representative of the direct power source for the memory array 22. In other words, the primary power rail can directly generate power to the memory cell 22. On the other hand, the secondary power rail operates to drain or leak the power from the primary power rail to the memory array 22 and is not directly generating power to the memory cell 22; rather, is a median for power flow between the primary power rail and the memory cell 22. The transistor devices T4 are electrically coupled between VCS node and V_VCS node in accordance with one embodiment. In the Sleep mode, power is not being supplied to memory array 22, thus maximum power savings is obtained in memory array 22; however, data stored in memory array 22 maybe lost.

In accordance with one exemplary embodiment, transistor device T2 of header driver 12 is configured to enable or control transistor devices T4 of distributed header device 14 to operate in a Wake mode or On mode. In one embodiment, Wake mode is enabled when a logical 1 from a logical gate of decoder device 20 is presented to transistor device T2, thus turning transistor T2 "ON". In one embodiment, the logical gate providing a logical 1 to transistor device T2 is a logical AND gate configured to receive the sleep signal 24 and the output of bank selection block 26. In operation, when transistor device T2 is turned "ON", the respective gates of transistor devices T4 are each lowered to a logical 0. Consequently, transistor devices T4 are turned on or operating in Wake mode. In Wake mode, transistor devices T4 electrically short the VCS node to the V_VCS node. In the Wake mode, maximum voltage is being supplied to memory array 22, thus power savings is not obtained in memory array 22.

In accordance with one exemplary embodiment, transistor device T3 of header driver 12 is configured to enable or control transistor devices T4 of distributed header device 14 to operate in a Retention mode. In one embodiment, Retention mode is enabled when a logical 0 from a logical gate of decoder device 20 is presented to transistor device T3, thus turning transistor T3 "ON". In one embodiment, the logical gate providing a logical 0 to transistor T3 is a logical OR gate configured to receive the sleep signal 24 and the output of bank selection block 26. In operation, when transistor device T3 is turned "ON", the respective gates of transistor devices T4 are each shorted to the corresponding drain of transistor devices T4. In other words, the V_VCS node is shorted to each of the gates of transistor devices T4, thus placing transistor devices T4 in Retention mode. In this mode, the voltage settles to one threshold voltage level of the transistor devices T4 below VCS (VCS-Vtp). The skilled artisan would appreciate that transistor T3 and each of the transistor devices T4 form a diode connected PFET configured for lowering the voltage level of V_VCS node to a threshold level below VCS where power savings is obtained and data is retained in memory array 22. In other words, the diode connected PFET formed with transistor T3 and transistor devices T4 limit how low the voltage level at V_VCS can be before data is lost in memory array 22. As such, data is retained through the diode connection by having the voltage level be regulated about the threshold level.

The WL driver 18 may be any conventional WL driver known in the art having circuitry for accessing the selected word line in memory array 22. The WL driver 18 is coupled to VCS and V_VCS such that the WL driver 18 may also operate in power savings mode (Sleep mode or Retention mode) when transistor devices T4 are operating in such mode as shown in FIG. 1. The WL driver 18 is also coupled to a word line in the memory array 22 for accessing information therein. As previously mentioned, each word line in memory array 22 has an associated WL driver; however, for simplistic purposes only one WL driver is illustrated in FIG. 1. Moreover, each memory array has an associated word line driver device that includes a number of WL drivers, such as the one illustrated in FIG. 2, that are respectively coupled to the word lines in each memory array. Each word line driver device is associated with the respective distributed header device and header driver that are associated with the respective memory array. As such, the WL drivers associated with memory array 22 each operate in power savings mode (Sleep mode or Retention) when transistor devices T4 are operating in such mode. This same operation is the true during Wake mode.

The WL driver 18 includes a transistor device PW that may selectively operate in Wake mode and a power-savings mode as shown in FIG. 1. During wake mode, V_VCS is shorted to VCS as described above. During this mode, the gate of transistor device PW is set to a logical 1, thus turning transistor device "OFF". When transistor device PW of WL driver 18 is turned "OFF", V_VCS equals VCS and power leakage occurs at a maximum level. During both Sleep mode and Retention mode, transistor device PW is set to a logical 0, thus turning transistor device "ON". When transistor device PW of WL driver 18 is turned "ON", V_VCS has a voltage level below VCS. The skilled artisan can appreciate that the voltage difference between the gate and the source of transistor device PW has the effect of raising the threshold voltage of device PW, which results in the occurrence of less power leakage. It should be appreciated that such scheme will provide approximately a 99% reduction of leakage in the WL driver. This is accomplished through the scheme described above which allows the WL drivers associated with the memory array of interest within the core array 16 to operate in Wake mode while the remaining WL drivers respectively associated with the other memory arrays within the core array 16 operate in either Sleep or Retention Mode.

Now referring to FIG. 3, illustrated is a table showing the combination of states of transistor devices T1, T2, T3 that enable sleep mode, wake mode, and retention mode respectively. Also illustrated is the state of V_VCS, which is the function of the states of transistor devices T1, T2, T3. As illustrated, when transistor device T1 is in logical state 0 (active), transistor device T2 is in logical state 0 (inactive), and transistor device T3 is in logical state 1 (inactive), then transistor devices T4 are open between VCS and V_VCS, thus V_VCS leaks to ground. When transistor device T1 is in logical state 1 (inactive), transistor device T2 is in logical state 1 (active), and transistor device T3 is in logical state 1 (inactive), then transistor devices T4 are shunted between VCS and V_VCS, thus VCS is shorted to V_VCS. When transistor device T1 is in logical state 1 (inactive), transistor device T2 is in logical state 0 (inactive), and transistor device T3 is in logical state 0 (active), then transistor devices T4 are configured to allow V_VCS to leak to VCS-Vtp, where Vtp is the threshold voltage of transistor T4 and where power savings is obtained and data is retained in memory array 22 as described above.

Figure 4:
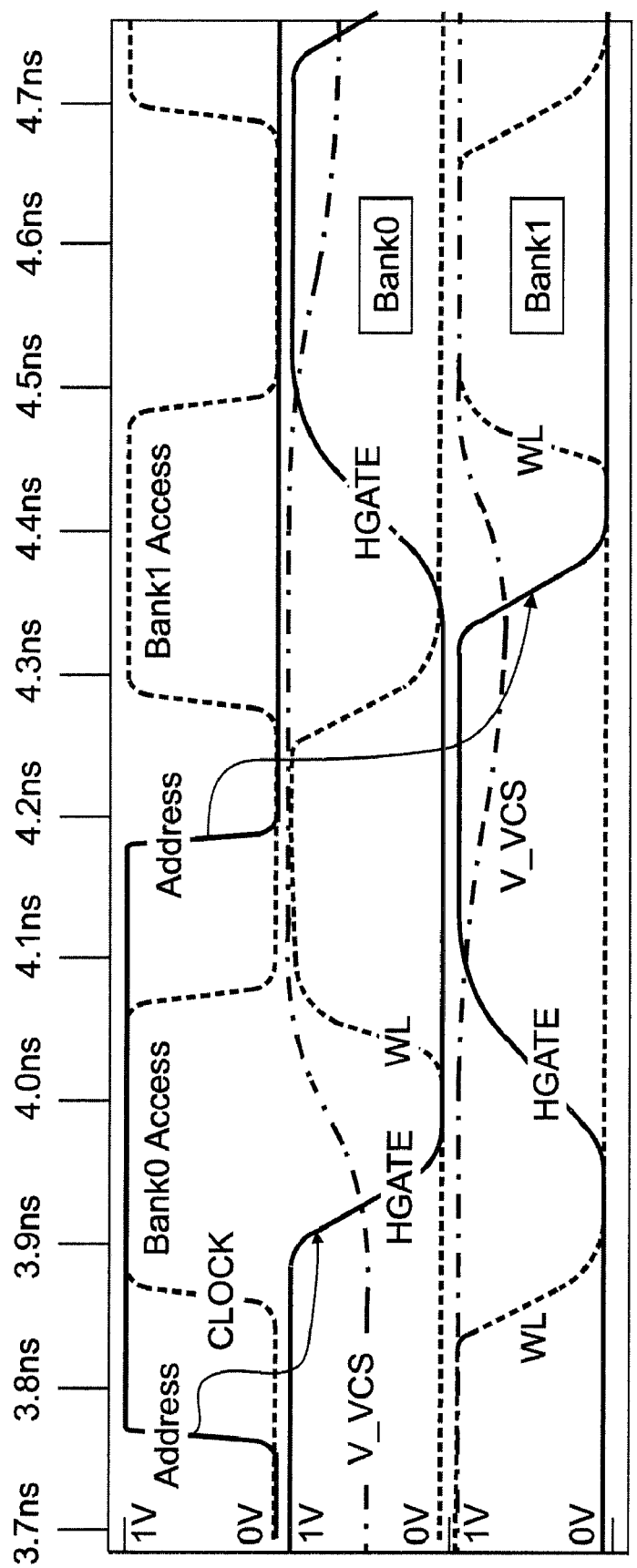
FIG. 4 illustrates a graphical representation of various signals when one memory array is activated while another memory array within the core array is in power savings mode.

In operation, only one memory array is powered on while the remaining memory arrays in core array 16 are placed in power savings mode (Sleep mode or Retention mode) at any given time in accordance with one exemplary embodiment of the present invention. FIG. 4 illustrates a graph of the various signals when one memory array is activated while another memory array within the core array is in power savings mode. This graph only illustrates two different banks or memory arrays in a core array; however, more than two banks may be disposed in the core array.

Figure 5:
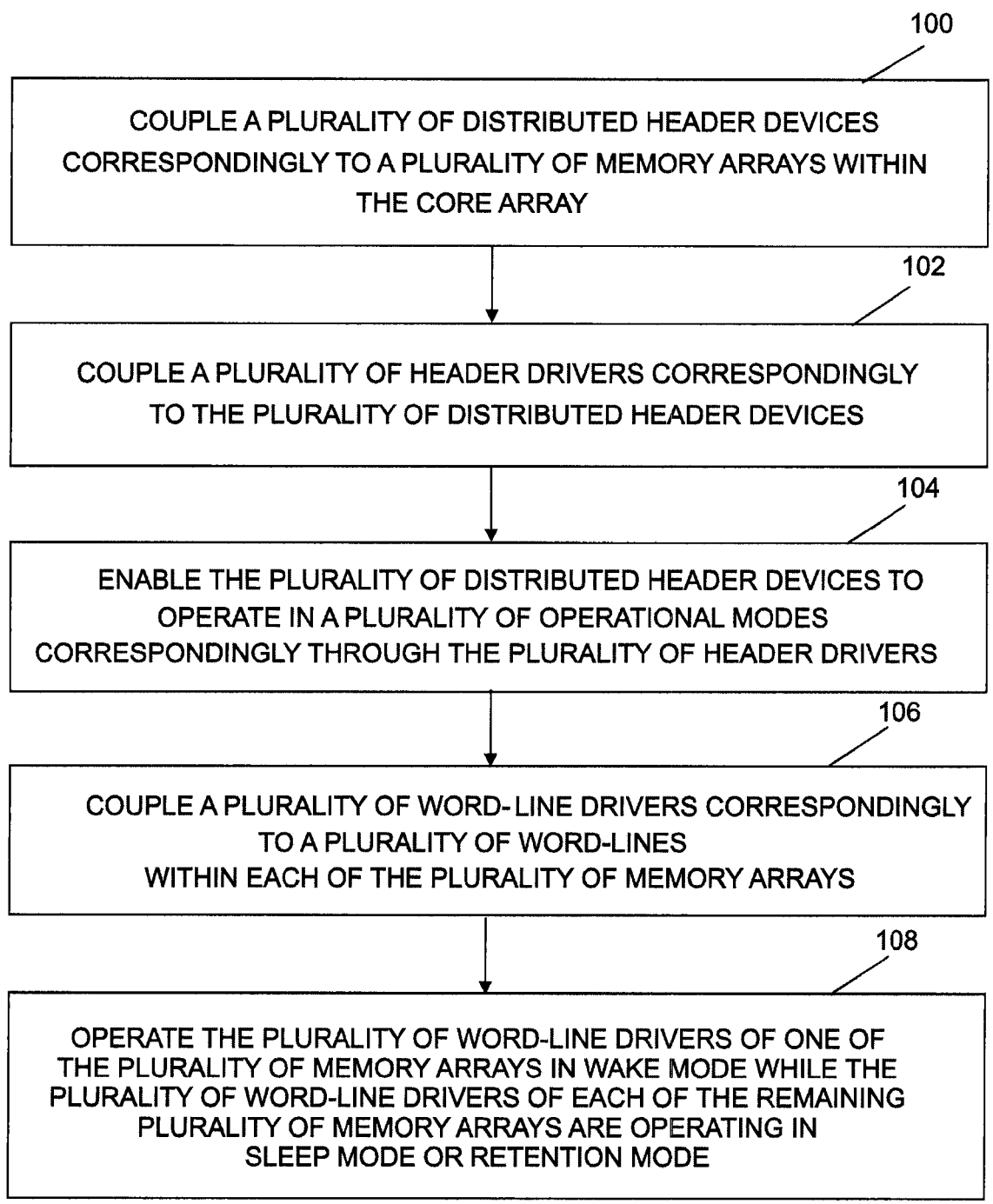
FIG. 5 illustrates a data flow diagram of an apparatus for implementing a low overhead switched header power savings scheme in accordance with one exemplary embodiment of the present invention.

In accordance with an exemplary embodiment of the present invention, an exemplary method for reducing leakage current in a core array is provided and illustrated in FIG. 5. In this exemplary method, couple a plurality of distributed header devices correspondingly to a plurality of memory arrays within the core array at block 100. The plurality of distributed header devices is configured for limiting leakage current correspondingly through the plurality of arrays. Next, couple a plurality of header drivers correspondingly to the plurality of distributed header devices in block 102. Then, enable the plurality of distributed header devices to operate in a plurality of operational modes correspondingly through the plurality of header drivers in block 104. The plurality of operational modes includes a sleep mode, a wake mode, and a retention mode as described above. In block 106, couple a plurality of word-line drivers correspondingly to a plurality of word-lines within each of the plurality of memory arrays. In block 108, operate the plurality of word-line drivers of one of the plurality of memory arrays in wake mode while the plurality of word-line drivers of each of the remaining plurality of word-line drivers are operating sleep mode or retention mode. The plurality of word-line drivers coupled to each of the plurality of memory arrays is configured for correspondingly accessing one of the plurality of word-lines or rows in each of the plurality of memory arrays.

Advantageously, the exemplary embodiments of the present invention provide a circuit to save on leakage power with minimal area penalty and no performance loss. Furthermore, the circuit technique disclosed above provides a unified method to save power on both the memory cells and WL drivers.

Figure 6:
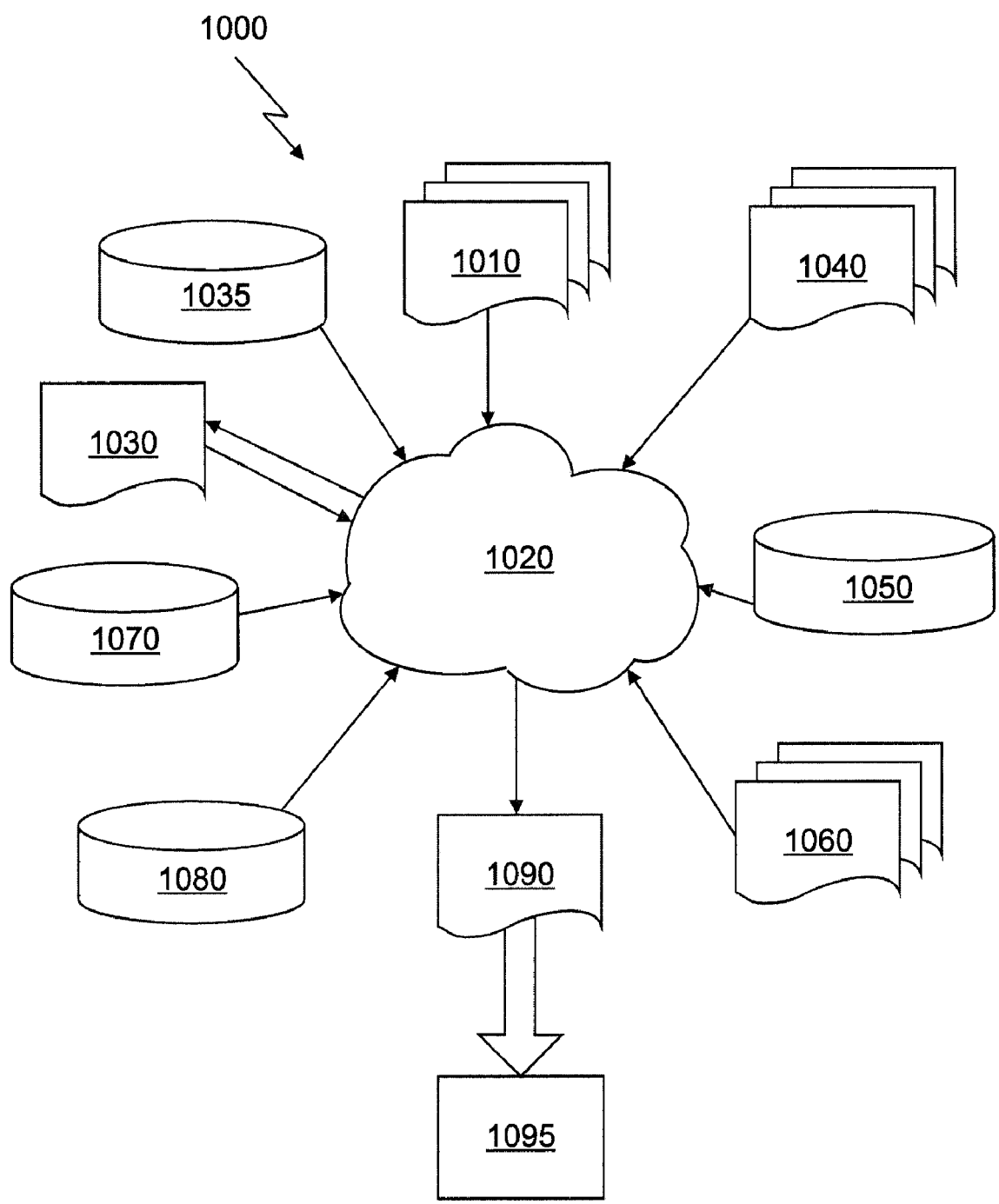
FIG. 6 illustrates a block diagram of an example of a design flow.

The embodiments discussed above may be incorporated into an integrated circuit (IC). FIG. 6 is a block diagram illustrating an example of a design flow 1000. Design flow 1000 may vary depending on the type of IC being designed. For example, a design flow 1000 for building an application specific IC (ASIC) will differ from a design flow 1000 for designing a standard component. Design structure 1010 is preferably an input to a design process 1020 and may come from an IP provider, a core developer, or other design company or may be generated by the operator of the design flow, or from other sources. Design structure 1020 comprises multi-mode power gating apparatus 10 in the form of schematics or HDL, a hardware-description language, (e.g., Verilog, VHDL, C, etc.). Design structure 1010 may be contained on one or more machine readable medium(s). For example, design structure 1010 may be a text file or a graphical representation of multi-mode power gating apparatus 10. Design process 1020 synthesizes (or translates) multi-mode power gating apparatus 10 into a netlist 1030, where netlist 1030 is, for example, a list of wires, transistors, logic gates, control circuits, I/O, models, etc., and describes the connections to other elements and circuits in an integrated circuit design and recorded on at least one of a machine readable medium. This may be an iterative process in which netlist 1030 is resynthesized one or more times depending on design specifications and parameters for the circuit.

Design process 1020 includes using a variety of inputs; for example, inputs from library elements 1035 which may house a set of commonly used elements, circuits, and devices, including models, layouts, and symbolic representations, for a given manufacturing technology (e.g., different technology nodes, 32 nm, 45 nm, 90 nm, etc.), design specifications 1040, characterization data 1050, verification data 1060, design rules 1070, and test data files 1080, which may include test patterns and other testing information. Design process 1020 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 1020 without deviating from the scope and spirit of the invention. The design structure of the invention embodiments is not limited to any specific design flow.

Design process 1020 preferably translates embodiments of the invention as shown in FIG. 1, along with any additional integrated circuit design or data (if applicable), into a second design structure 1090. Second design structure 1090 resides on a storage medium in a data format used for the exchange of layout data of integrated circuits (e.g. information stored in a GDSII (GDS2), GL1, OASIS, or any other suitable format for storing such design structures). Second design structure 1090 may comprise information such as, for example, test data files, design content files, manufacturing data, layout parameter, wires, levels of metal, vias, shapes, data for routing through the manufacturing line, and any other data required by a semiconductor manufacturer to produce embodiments of the invention as shown in FIG. 1. Second design structure 1090 may then proceed to a state 1095 where, for example, second design structure 1090: proceeds to tape-out, is released to manufacturing, is released to a mask house, is sent to another design house, is sent back to the customer, etc.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A design structure embodied in a machine readable medium used in a design process, the design structure comprising:

a multi-mode power gating apparatus for reducing leakage current in a core array, wherein the apparatus comprises:
a plurality of distributed header devices correspondingly coupled to a plurality of memory arrays within the core array, each of the plurality of distributed header devices having a plurality of transistor devices in parallel connection with respect to one another, the plurality of transistor devices correspondingly coupled to a plurality of columns within each of the plurality of memory arrays, and each of the plurality of distributed header devices configured for limiting leakage current through each of the plurality of memory arrays;

a plurality of header drivers correspondingly coupled to the plurality of distributed header devices, the plurality of header drivers being configured for correspondingly enabling the plurality of distributed header devices to operate in a plurality of operational modes including a sleep mode, a wake mode, and a retention mode, at least one of the plurality of distributed header devices is operating in wake mode while the remaining of the plurality of distributed header devices are operating in sleep mode or retention mode when the core array is accessed; and a plurality of word-line drivers correspondingly coupled to a plurality of word-lines within each of the plurality of memory arrays, the plurality of word-line drivers coupled to each of the plurality of memory arrays is configured for correspondingly accessing one of the plurality of word-lines in each of the plurality of memory arrays, the plurality of word-line drivers coupled to each of the plurality of memory arrays further configured for operating in the plurality of operational modes, the plurality of word-line drivers of one of the plurality of memory arrays is operating in wake mode while the plurality of word-line drivers of each of the remaining plurality of memory arrays are operating in sleep mode or retention mode reducing power leakage in the plurality of word-line drivers, the operation of the plurality of word-line drivers of each of the plurality of memory arrays being controlled by at least one of the plurality distributed header devices.

2. The design structure of claim 1, wherein the plurality of transistor devices of each of the plurality of distributed header devices is configured for selectively operating in a first position between a primary power rail and a secondary power rail for enabling operation in the sleep mode, the plurality of transistor devices further configured for selectively operating in a second position between the primary power rail and the secondary power rail for enabling operation in the wake mode, and the plurality of transistor devices configured for selectively operating between the first position and the second position for enabling operation in the retention mode, the plurality of transistor devices in each of the plurality of distributed header devices is operating the same mode.

3. The design structure of claim 1, wherein the design structure comprises a netlist describing the multi-mode power gating apparatus for reducing leakage current in a core array.

4. The design structure of claim 1, wherein the design structure resides on storage medium as a data format used for the exchange of layout data of integrated circuits.

5. The design structure of claim 1, wherein the design structure includes at least one of test data files, characterization data, verification data, programming data, or design specifications.

\* \* \* \* \*